(12) United States Patent
Madocks

(10) Patent No.: US 7,411,352 B2
(45) Date of Patent: Aug. 12, 2008

(54) DUAL PLASMA BEAM SOURCES AND METHOD

(75) Inventor: John E. Madocks, Tucson, AZ (US)

(73) Assignee: Applied Process Technologies, Inc., Tucson, AZ (US)

(*) Notice: Subject to any disclaimer, the term of this patent is extended or adjusted under 35 U.S.C. 154(b) by 0 days.

(21) Appl. No.: 11/379,349

(22) Filed: Apr. 19, 2006

(65) Prior Publication Data

US 2006/0177599 A1 Aug. 10, 2006

Related U.S. Application Data

(63) Continuation-in-part of application No. 10/528,386, filed as application No. PCT/US03/29204 on Sep. 19, 2003.

(60) Provisional application No. 60/412,051, filed on Sep. 19, 2002.

(51) Int. Cl.
 *H01J 7/24* (2006.01)
(52) U.S. Cl. .................. 315/111.21; 315/111.41; 315/111.71; 118/723 E; 118/723 MW; 204/298.19
(58) Field of Classification Search ............ 315/111.21, 315/111.41, 111.71, 111.91; 118/723 DC, 118/723 E, 723 ER, 723 ME, 723 MW, 723 MR; 204/192.12, 298.19, 298.36–298.38
See application file for complete search history.

(56) References Cited

U.S. PATENT DOCUMENTS

| | | | |
|---|---|---|---|
| 3,878,085 A | 4/1975 | Corbani | |
| 4,868,003 A | 9/1989 | Temple et al. | |
| 4,871,918 A | 10/1989 | Miljevic | |
| 4,915,805 A | 4/1990 | Rust | |
| 4,933,057 A | 6/1990 | Sebastiano et al. | |
| 4,941,430 A | 7/1990 | Wantanabe et al. | |
| 5,069,770 A | 12/1991 | Glocker | |

(Continued)

FOREIGN PATENT DOCUMENTS

WO WO 2004/031441 4/2004

OTHER PUBLICATIONS

B. Window and N. Savvides, "Unbalanced dc magnetrons as sources of high ion fluxes", Journal of Vacuum Science and Technology A, vol. 4 (3), May/Jun. 1986.

(Continued)

*Primary Examiner*—Haissa Philogene
(74) *Attorney, Agent, or Firm*—Lawrence R. Oremland, P.C.

(57) ABSTRACT

A pair of plasma beam sources are connected across an AC power supply to alternatively produce an ion beam for depositing material on a substrate transported past the ion beams. Each plasma beam source includes a discharge cavity having a first width and a nozzle extending outwardly therefrom to emit the ion beam. The aperture or outlet of the nozzle has a second width, which second width is less than the first width. An ionizable gas is introduced to the discharge cavity. At least one electrode connected to the AC power supply, alternatively serving as an anode or a cathode, is capable of supporting at least one magnetron discharge region within the discharge cavity when serving as a cathode electrode. A plurality of magnets generally facing one another, are disposed adjacent each discharge cavity to create a magnetic field null region within the discharge cavity.

30 Claims, 14 Drawing Sheets

U.S. PATENT DOCUMENTS

| | | | |
|---|---|---|---|
| 5,073,245 A | 12/1991 | Hedgcoth | |
| 5,133,850 A | 7/1992 | Kukla et al. | |
| 5,334,302 A | 8/1994 | Kubo et al. | |
| 5,482,611 A | 1/1996 | Helmer et al. | |
| 5,614,248 A | 3/1997 | Schiller et al. | |
| 5,656,141 A | 8/1997 | Betz et al. | |
| 5,728,280 A | 3/1998 | Scherer | |
| 5,838,120 A | 11/1998 | Semenkin et al. | |
| 5,904,952 A | 5/1999 | Lopata et al. | |
| 5,908,602 A | 6/1999 | Bardos et al. | |
| 6,103,074 A | 8/2000 | Khominich | |
| 6,137,231 A * | 10/2000 | Anders et al. | 315/111.21 |
| 6,444,100 B1 | 9/2002 | McLeod | |
| 6,444,945 B1 | 9/2002 | Maschwitz et al. | |
| 6,446,572 B1 * | 9/2002 | Brcka | 118/723 ER |
| 6,734,434 B1 | 5/2004 | Sainty | |
| 6,911,779 B2 * | 6/2005 | Madocks | 315/111.21 |
| 6,919,672 B2 * | 7/2005 | Madocks | 313/359.1 |
| 7,038,389 B2 * | 5/2006 | Madocks | 315/111.21 |
| 2002/0153103 A1 | 10/2002 | Madocks | |
| 2003/0230961 A1 | 12/2003 | Madocks | |
| 2004/0074443 A1 | 4/2004 | Madocks | |
| 2004/0135485 A1 | 7/2004 | Madocks | |
| 2004/0149574 A1 | 8/2004 | Madocks | |
| 2004/0155592 A1 | 8/2004 | Madocks | |
| 2004/0217713 A1 | 11/2004 | Madocks | |
| 2005/0247885 A1 | 11/2005 | Madocks | |
| 2006/0000705 A1 | 1/2006 | Hartig et al. | |

OTHER PUBLICATIONS

B. Window and G.L. Harding, "Ion-assisting magnetron sources: Principles and uses", Journal of Vacuum Science and Technology A, vol. 8 (3), May/Jun. 1990.

B. Window and N. Savvides, "Charged particle fluxes from planar magnetron sputtering sources", Journal of Vacuum Science and Technology A, vol. 4 (2), Mar./Apr. 1986.

G. Este and W.D. Westwood, "A quasi-direct-current sputtering technique for the deposition of dielectrics at enhanced rates", J. Vac. Sci. Technol. A, vol. 6 (3), May/Jun. 1988.

M. Scherer, J. Schmitt, R. Latz and M. Schanz, "Reactive alternating current magnetron sputtering of dielectric layers" J. Vac. Sci. Technol. A, vol. 10(4) Jul./Aug. 1992.

* cited by examiner

DUAL PLASMA BEAM SOURCES AND METHOD

CROSS REFERENCE TO RELATED APPLICATION

The present application is a continuation-in-part application of co-pending U.S. application Ser. No. 10/528,386, filed Mar. 17, 2005. This application also claims priority from PCT Application No. PCT/US03/29204, filed Sep. 19, 2003 and U.S. Provisional Patent Application Ser. No. 60/412,051, filed Sep. 19, 2002.

BACKGROUND OF THE INVENTION

1. Field of the Invention

The present invention relates generally to methods and apparatus for generating plasma and ion and to the use thereof. The invention has particular utility with respect to plasma and ion sources used for industrial processes such as plasma treatment, plasma enhanced chemical vapor deposition (PECVD) and plasma etching of substrates and will be described in connection with such utility, although other utilities are contemplated such as for use as electric propulsion devices for space applications.

2. Description of Related Art

Plasma and ion sources are usefully applied in a number of processes including: Plasma enhanced chemical vapor deposition (PECVD), reactive ion etching, plasma surface modification and cleaning, increasing the density of evaporated or sputtered films and assisting a reactive evaporation or sputtering process. Of growing interest is the application of these processes to larger substrates such as flexible webs, photovoltaic panels and architectural and vehicle glass.

Several plasma and ion sources are commercially available and many more have been disclosed. Commercially available plasma and ion sources include: Hollow cathode plasma sources, gridded ion sources, end hall ion sources, closed drift type ion sources (both extended acceleration channel and anode layer types) and impeded anode types such as the APS Pro available from Leybold Optics USA. While successfully applied to small substrate applications like semiconductors or optical filters, they are less effective in processing wide substrate applications. This is primarily due to the use of point electron sources for beam creation and neutralization. Point electron source technologies such as filaments, heated low work function materials and hollow cathodes are difficult to linearly extend. Consequently, the ion and plasma sources that rely on these point electron sources have difficulty producing the uniform linear beams required for large area substrates. In the case of anode layer ion sources, while a uniform ion beam is emitted over a long source length, these sources suffer from lack of ion density and the beam can be difficult to neutralize for long sources.

Therefore, there is a need for a uniform, linear plasma or ion source that can be readily extended to wide substrates. This ideal linear source should also not require a delicate or expensive electron source, such as filaments or LaB6 cathodes, and should be capable of operating over a wide process pressure range. This source should also be physically compact, economical and should produce a dense, efficient plasma beam.

Another important criterion for the ideal linear plasma source is the ability to maintain a continuous PECVD process without excessive coating of the source. In prior art sources such as Lopata et al. in U.S. Pat. No. 5,904,952, the source electrode is exposed to the precursor gases and substrate in the process chamber. The result is that while useful coatings may be deposited on the substrate, the source is quickly coated causing process drift and arcing. In semiconductor batch applications, an etch process is run after set intervals to clean the exposed electrode(s). In continuous processes, such as roll to roll web or in-line coating systems, a PECVD process must run for many 10's of hours without stopping. In these applications an etch cleaning cycle is not practical. Therefore, a linear plasma source is needed that maintains stable operation over long continuous process runs.

Prior art relevant to the present invention can be grouped into three categories: Unbalanced magnetron sputtering sources, hollow cathode sputtering sources and plasma and ion sources.

Unbalanced Magnetron Sources

Window and Savvides presented the concept of unbalanced magnetron (UBM) sputter cathodes in several published articles. In these articles, a Type II unbalanced magnetron is disclosed with its ability to ionize the sputtered flux from the cathode. The fundamental operating principles of the null magnetic field region and mirror magnetic confinement electron trapping are taught.

A planar target type II UBM as presented by Window and Savvides is shown as prior art in FIG. 13. Window and Harding later disclosed a type II UBM without a central magnetic material or high permeability pole. In FIG. 13, magnets 200 are configured around the periphery of a rectangular or round shunt plate 201. Central soft iron pole 207 is located in the center of the shunt plate 201. Due to the unequal magnetic strengths of the peripheral and center poles, a null field point 203 is created above magnetron trap 205 and strengthening field lines above the null point produce a mirror confinement region 208. In operation, magnetron plasma 204 sputters target 206. Electrons leaving the magnetron plasma are trapped in the mirror containment region 208 creating a second visible plasma region. As presented in the literature, the mirror plasma region ionizes a significant portion of the sputter flux from the target. Plasma 208 generated in the mirror region also projects out to substrate 209 and usefully bombards the growing sputtered film. Plasma 208 can be used for plasma processes such as PECVD, plasma treatment etc. While finding use in plasma source applications, the sputtered flux from target 206 is not always welcome, the UBM must operate in the mTorr range typical for magnetron sputtering and, for PECVD applications, and exposed target 206 is quickly contaminated by condensing PECVD constituents.

Hollow Cathode Sputter Sources

The term Hollow Cathode has been used to describe a variety of sputter sources in the prior art.

Rust in U.S. Pat. No. 4,915,805 discloses a hollow cathode confined magnetron with the substrate passing through the center of the cavity.

Sebastiano et al. in U.S. Pat. No. 4,933,057 discloses a hollow cathode configured magnetron with an anode positioned opposite from the opening into the process chamber. The anode in this position will allow electrons to reach the anode without having to pass out of the discharge cavity first. No gas is introduced into the discharge cavity separate from the opening to the process chamber.

Hedgcoth in U.S. Pat. No. 5,073,245 teaches a sputter source in a cavity separate from the process chamber. The magnetic field is along the axis of the cavity cylinder and a magnetron type containment region is reported to be created around the inside of the cavity cylinder walls. The opening to the process chamber creates a discontinuity in the magnetron racetrack. Anodes are located inside the cavity, at each end.

Kubo et al. in U.S. Pat. No. 5,334,302 discloses a sputtering apparatus comprised of multiple magnetron cathode cavities. Process gas is introduced into the base of each cavity. The cavities are open to the process chamber.

Helmer et al. in U.S. Pat. No. 5,482,611 discloses an unbalanced magnetron sputter cathode with a cup shaped or annular cathode. A null magnetic field point is produced adjacent to the cathode opening. The discharge cavity is open to the process chamber. In FIG. 6 of this patent a separate microwave applicator is fitted over the cathode opening. Though separate from the cathode, the applicator opening dimensions are equal to or larger than the cathode cavity. In one embodiment process gas is introduced into the cavity at the base of the cavity opposite the process chamber opening.

Scherer in U.S. Pat. No. 5,728,280 teaches an apparatus for coating substrates by cathode sputtering with a hollow target. The magnetron discharge in the cavity is balanced such that a weak null point is produced well outside the cavity in the process chamber.

Bardos et al. in U.S. Pat. No. 5,908,602 teaches a linear arc discharge source. The discharge cavity does not include a magnetron confined plasma region and the discharge cavity opening is exposed to the process chamber.

McLeod in U.S. Pat. No. 6,444,100 discloses a box shaped hollow cathode sputter source. The bottom of the box is either electrically floating or connected to the cathode. The box is open to the process chamber and process gas is not introduced into the box other than via the process chamber opening.

Other Plasma Sources

Maschwitz et al in U.S. Pat. No. 6,444,945 teaches a bipolar plasma source, plasma sheet source, and effusion cell utilizing a bipolar plasma source. In the preferred embodiment, a magnetron cathode plasma is not created and the hollow cathode cavity opening is exposed to the process chamber.

Miljevic in U.S. Pat. No. 4,871,918 discloses a hollow-anode ion-electron source comprising a discharge cavity with a reduced dimension opening conduit to the process chamber. There is no magnetron confined region or null magnetic field point within the discharge cavity.

Khominich in U.S. Pat. No. 6,103,074 teaches a cathode arc vapor deposition method and apparatus that implements a cusp magnet field. There is no magnetron confined region inside the discharge cavity and the cavity is open to the process chamber.

SUMMARY OF THE INVENTION

The present invention provides an improvement over the aforesaid and other prior art plasma and ion sources. More particularly, the present invention employs a pair of plasma sources, each having a discharge cavity with a first width, and a nozzle extending outwardly therefrom. Each nozzle has a second width, where the second width is less than the first width. Each plasma source further includes a conduit disposed in the discharge cavity for introducing an ionizable gas into the discharge cavity, and at least one electrode connected to an AC power supply. The electrode is capable of supporting at least one magnetron discharge region within the discharge cavity. Each plasma source further includes a plurality of generally facing magnets disposed adjacent the discharge cavity, which plurality of magnets create a null magnetic field point within the discharge cavity. The electrode of each plasma beam source, being connected to the AC power supply, alternatively during each half cycle, serves as either an anode or as a cathode electrode. The ionizable gas within each plasma beam source is ionized and forms linear plasma and ion beams emanating through the source nozzles. Outside the sources, a condensable precursor gas is distributed. The precursor gas is activated by the plasma and ion beams. A substrate is conveyed adjacent the first and second plasma beam sources and a thin film is deposited on the substrate by the activated gas.

BRIEF DESCRIPTION OF THE DRAWINGS

The present invention will be described with greater specificity and clarity with reference to the following drawings, in which like numerals depict like parts, and wherein.

DETAILED DESCRIPTION OF THE PRESENTLY PREFERRED EMBODIMENTS

Figure 1:
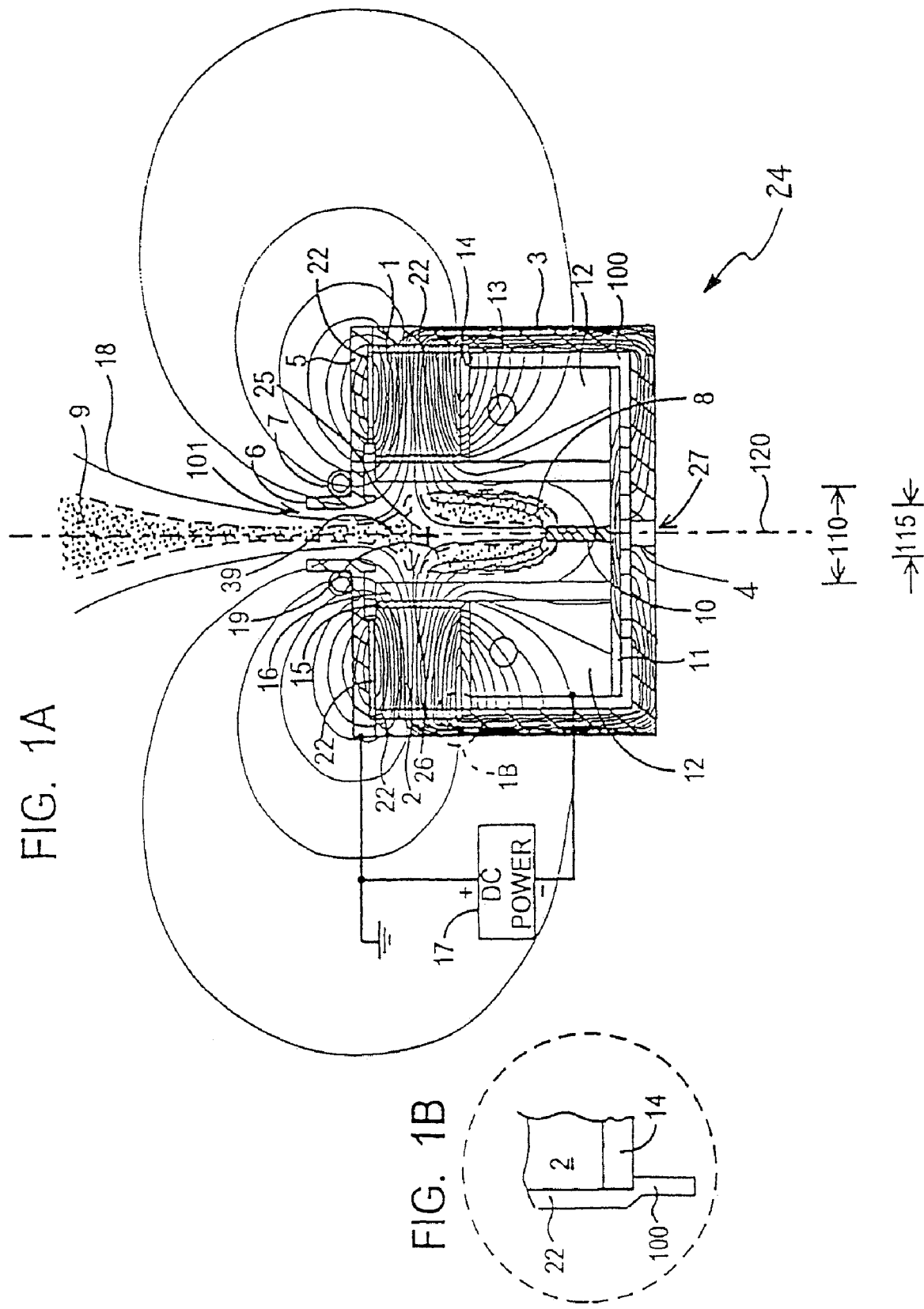
FIG. 1A shows a section view of a plasma beam source in accordance with the present invention.
FIG. 1B shows an enlarged view of the process gas conduit in the plasma beam source box, taken within dashed circle 1B shown in FIG. 1.

FIG. 1A shows a section view of a plasma beam source 24 producing a beam of dense plasma 9 projecting from a nozzle 6. The source resides in a process chamber, not shown, at a reduced pressure. Magnets 1 and 2 are disposed facing each other with the south poles supported by magnetic steel shunt box 3. The magnets 1 and 2 produce a cusp magnetic field composed of outwardly directed field lines 18 and inwardly directed lines 19. Inwardly directed lines 19 pass through insulator 15 and liner 16 to center shunt 10. The cusp magnetic field creates a null magnetic field region 25 inside discharge cavity 26. Magnets 1 and 2 and end magnets 20 and 21 (see FIG. 2) create endless electron traps in plasma regions 9 and 8. Shunt 10 is connected to shunt 11, and both are made of magnetic steel. Liner 16 is brazed to block 12 to improve heat transfer. Block 12 is water cooled via gun drilled holes 13 and piping (not shown). Shunt 11 is fastened to block 12. The assembly of liner 16, block 12 and shunts 10 and 11 form one electrode of the source. The second electrode is formed by shunt box 3 and cover 5. The magnets are ceramic type isolated from liner 16 and block 12 by insulating pieces 14 and 15. Insulating pieces 14 and 15 can be fabricated from fluoropolymer or an electrically insulating ceramic material. Gaps 100 of approximately 3 mm separate box 3 from block 12 and shunt 11 to eliminate plasma in the gap. Gas 27 is brought into the source through port 4 in box 3. Gas 27 travels around block 12 in gap 100 between box 3 and block 12. Gas 27 then flows into multiple thin trenches 22 cut into box 3 and cover 5. FIG. 1B shows a detail of these gas conduits. Gas 27 exits into discharge cavity 26 between cover 5 and liner 16. Cover 5 includes a nozzle 6 though which gas 27 flows into the process chamber. Cover 5 and nozzle 6 are water cooled with brazed-on tubing 7. One pole of power supply 17 is connected on one side to cover 5, box 3 and to chamber ground. The other pole of power supply 17 is connected to internal block assembly 12 (and consequently liner 16 and shunts 10 and 11). The electrical connection to block 12 is made to the water cooling tubing exiting box 3 (tubing not shown). Power supply 17 can be a standard sputter magnetron type or be a pulsed DC, mid-frequency AC or RF supply. In FIG. 1A a DC supply 17 is used with the negative electrode connected to block 12. When gas 27 is introduced into discharge cavity 26 and power supply 17 is turned on, a plasma is ignited in regions 8 and 9 of the source. Region 8 is an endless Hall current contained plasma extending the length of the source. The two lobes of region 8, as seen in the section view of FIG. 1A, appear as an extended donut of plasma when the inside of the operating source is viewed. Region 8 is created when the electric field from cover 5 penetrates down past magnetic field lines 19 inside the source. As electrons attempt to follow these electric field lines, they are restricted by magnetic field lines 19. As is known in many other Hall current contained sources, such as sputter magnetrons or closed drift ion sources, electrons cannot escape from the electrostatically and magnetically confined region made by electron containing liner 16 and shunt 10 surfaces and field lines 19. The result is a confined plasma region 8 inside discharge cavity 26.

Plasma region 9 is created and sustained as a result of plasma 8. By the arrangement of magnetic field lines 18, cover 5 and nozzle 6, electrons created by plasma 8 are prevented from reaching cover 5 and nozzle 6 anode electrode. As can be seen, field lines 18 pass out of liner 16, converge and exit through nozzle 6. Since electrons cannot cross magnetic field lines, the electric circuit between cover 5, nozzle 6 and plasma 8 can only be completed by the electrons exiting through nozzle 6 and passing out of the magnetic field 18 containment region. Plasma 9 is created because, when electrons attempt to escape along magnetic field lines 18 through the nozzle 6, they are confronted with a magnetic mirror as field lines 18 converge in nozzle 6. This mirror region reflects a portion of the electrons and creates a second containment region 39 within plasma 9. Region 39 is again a closed drift magnetic bottle as electrons move in a cycloid motion down to one end of the source and back to the other. This Hall current drift is due to crossed electric and magnetic fields and to gradient magnetic fields within mirror region 18.

The only escape path for plasma 8 electrons from discharge cavity 26 is through nozzle 6. Nozzle 6 also forms the only escape path for gas 27 flowing from discharge cavity 26 to the process chamber. Consequently a high degree of gas 27 is ionized in exiting nozzle 6. The confluence of gas 27 and electrons in region 39 creates a dense plasma 9 that extends out of nozzle 6 into the process chamber. When source 24 is viewed in operation, it appears that plasma 39 and plasma 9 are one plasma. The internal dimension of nozzle 6 is smaller than the width dimension of discharge cavity 26. By making nozzle 6 narrower, less sputtered material from liner 16 is able to reach the process chamber, ionization of process gas 27 is optimized flowing through nozzle 6 and gas influx from the process chamber into discharge cavity 26 is limited both by the narrow opening and gas 27 outflow.

Figure 2:
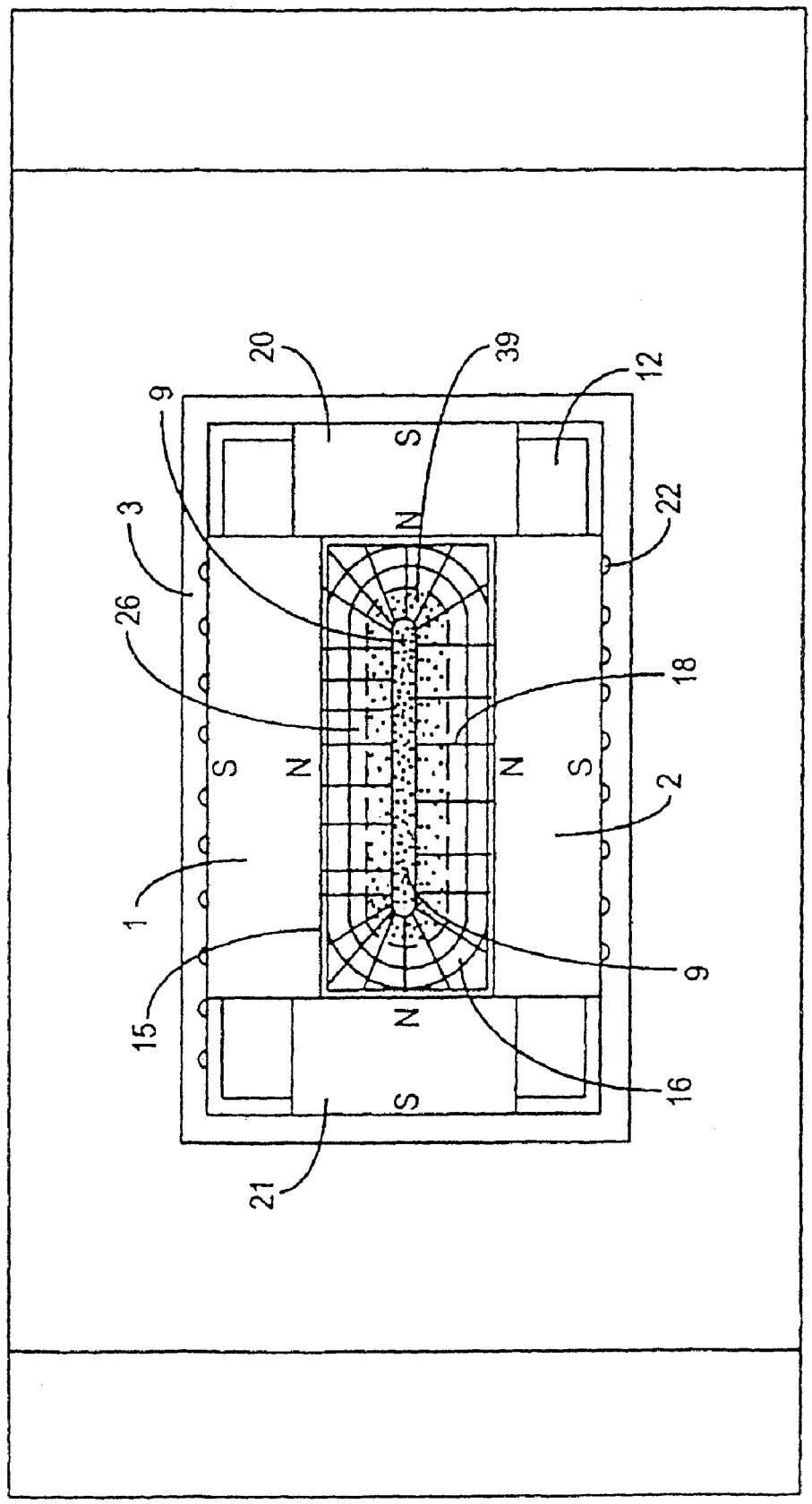
FIG. 2 shows a top section view of the apparatus of FIG. 1 with the cover removed.

FIG. 2 shows a top view of plasma beam source 24 depicted in FIG. 1A with cover 5 removed. This view shows end magnets 20 and 21 that along with side magnets 1 and 2 create the closed drift magnetic fields 18 and 19 (only field 18 is shown in this view). Also visible are box 3, liner 16, insulators 15, center shunt 10 and, water cooled block 12 below magnets 1, 2, 20 and 21. Trenches 22 in box 3 for gas 27 can also be seen. Plasma 39 is shown as the lighter dotted region in the center source area. The darker dotted portion corresponds to plasma region 9 at its narrowest section as it exits nozzle 6.

Figure 3:
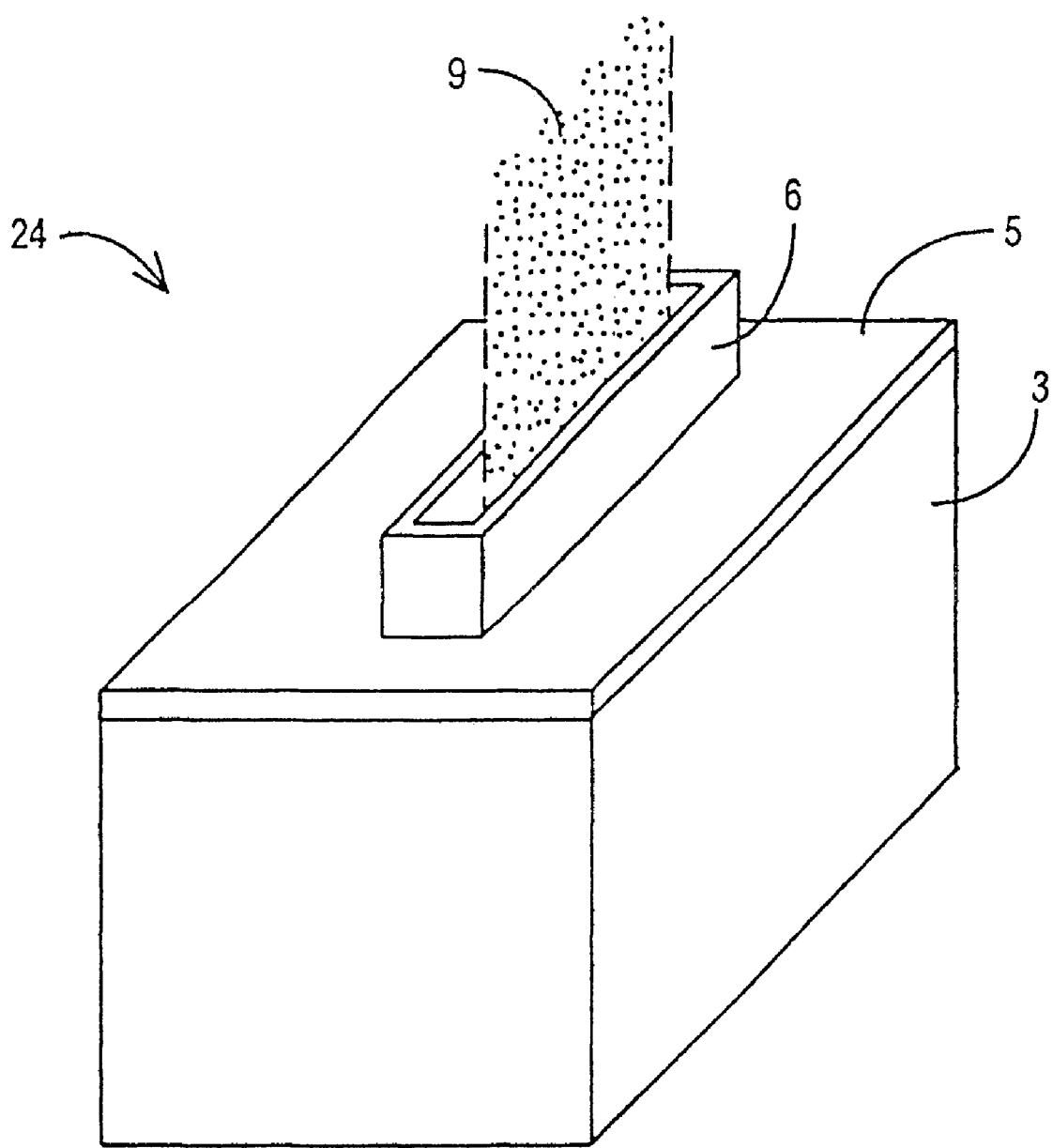
FIG. 3 shows an isometric view of the apparatus of FIG. 1.

FIG. 3 shows an isometric view of plasma beam source 24 depicted in FIGS. 1A and 2. Water cooling piping is not shown (the water piping is useful to also make electrical connections to both electrodes). In this view, plasma 9 is seen emanating out of nozzle 6. Plasma 9 forms a narrow uniform beam fanning out from nozzle 6.

The plasma beam source shown in FIGS. 1A-3 may be constructed as follows: Magnets 1 and 2 are a ceramic type measuring 1" wide×4" long×1" thick. Magnets 20 and 21 are 2" long×1" wide×2" thick. Box 3 is made of 0.25" thick mild steel plates. Block 12 is of brass. Top cover 5 and nozzle 6 are of copper. The opening in nozzle 6 is 0.50" wide×0.75" deep× 3.25" long. Shunt 10 is of mild steel, as is shunt 11. Liner 16 is a copper sheet bent into an oval shape and the distance between the inside walls of liner 16 is 1.25" in the short dimension (width) and 3.75" in the long dimension (length). Liner 16 is 3.0" deep. Referring to FIG. 1A, the nozzle opening has a dimension of 0.50" that corresponds to width 115. Liner 16 width dimension is 1.25" and corresponds to width 110 of discharge cavity 26.

While specific dimensions are given for the preferred embodiment in FIGS. 1A-3, as those skilled in the art will appreciate, many variations and modifications can be made without departing from the present invention. For instance, the scale of the source as well as specific dimensions of the source can be changed. Also the construction materials can be altered.

The plasma beam source and emanating plasma 9 have several interesting and useful properties as indicated by the following measured values:

Plasma 9 is very dense, with ion densities exceeding $10^{12}$ per cm$^3$ for a DC power supply output of 1 kW at ~300V. The ion saturation current was measured at over 100 mA for the source dimensions given and these power supply settings. (The current probe surface was positioned 5 cm beyond the end of nozzle 6 blocking plasma 9.) Electron current with the probe grounded is greater than 1 A.

Due to the Hall current confinement of plasma 9, plasma 9 tends to be uniform over the length of the source (minus end effects at the turnarounds). This is important for all applications where uniformity of deposition, treatment or etching is required (as it is in most applications). Substrate widths of 3 meters or more can be uniformly processed. In operation, plasma 9 appears as a ~one cm wide uniform beam projecting out of nozzle 6.

The plasma beam source (PBS) is not a sputter source. The purpose of the source is for PECVD, plasma treatment or etching processes. While sputtering of the liner material does occur, only minimal sputtered material exits the nozzle. This is due to at least two factors: The magnetron plasma region 8 (referring to FIG. 1A) is located deep inside the source and sputtered liner material tends to re-deposit on the liner, shunts 10 and 11 or on the cover 5 and nozzle 6. Since the sputtered material readily condenses on contact with a surface, the design produces a "torturous path" for sputtered material attempting to exit the source. Secondly, by feeding process gas in above magnetron plasma 8, the flow of supply gas to plasma 8 is directed away from nozzle 6, creating directional momentum effects opposing condensate flow out of nozzle 6. The low sputter rate of the source is seen in operation. For instance, in depositing a PECVD Silicon Oxide coating of several microns, the resulting coating was optically clear. This result was obtained using a copper liner 16. Sputtered copper in oxygen and argon gas shows up as a black coating. This was not visible on the substrate.

Pure reactive gas can be "burned" in this source. Many high density plasma sources implement filaments, low work function materials or field effect devices to generate electrons. These sources typically feed an inert gas such as argon into the source. Use of a reactive gas such as oxygen inside these prior art sources tends to greatly shorten the electron source lifetime. To accomplish a reactive process, these sources feed oxygen outside the source, reacting a portion of the oxygen with the argon plasma exiting the source. While the efficiency of this method is low, it is used today in many processes because no alternative exists. The PBS changes this with the ability to directly produce a high density, pure oxygen plasma. This has advantages for several processes. Also, the vacuum pumping requirements are reduced as argon gas flow is not needed.

The PBS can be operated over a wide range of process pressures. As is typical for magnetron type sources, the PBS can readily operate at pressures in the 1-100 mTorr region. In addition to this pressure range, operation can be extended down to the 10-5 Torr range used in evaporation processes. This can be done because nozzle 6 limits gas conductance out of the source. By feeding the process gas 27 into discharge cavity 26, the pressure inside the discharge cavity can be sustained in the mTorr region while outside the source a much lower process pressure exists. Also, process gas flow requirements are minimized because discharge cavity 26 can be maintained in the required mTorr region with less gas 27 flow due to the conductance limitation presented by the narrow opening of nozzle 6.

Continuous deposition of insulating PECVD films is possible. In PECVD, the electrodes often are coated up during the process. With insulating films such as $SiO_2$, this can cause arcing or the complete cessation of the operation. With the PBS, the nozzle limits conductance of the condensable gas species into the discharge cavity so the internal magnetron electron source is not contaminated. This is an important benefit to the PBS for large area PECVD processes and is discussed further below.

The plasma beam 9 extends for 100's of mm from nozzle 6 depending upon the free mean path inside the process chamber. At 3 mtorr for instance, the beam extends at least 300 mm. This property allows the beam source to excel at many applications. For instance, non-planar 3D substrates can be uniformly PECVD coated, treated, etc.

The substrate can be electrically isolated from the PBS. Because the substrate is only optionally part of the electrical circuit, the substrate can be grounded, remain floating or be separately biased by a different power supply. This feature is illustrated in later figures.

PBS 24 operates using standard DC magnetron power supplies or with alternating current power supplies at a variety of frequencies from 0-100 MHz frequencies. In FIGS. 1A-3, shunt box 3 and cover 5 are connected to ground. This is convenient because less high voltage is exposed to the chamber (safety) and mounting is made easier. Alternatively, external components box 3 and cover 5 can be electrically floated. Some of possible configurations are shown in the figures to follow.

Figure 4:
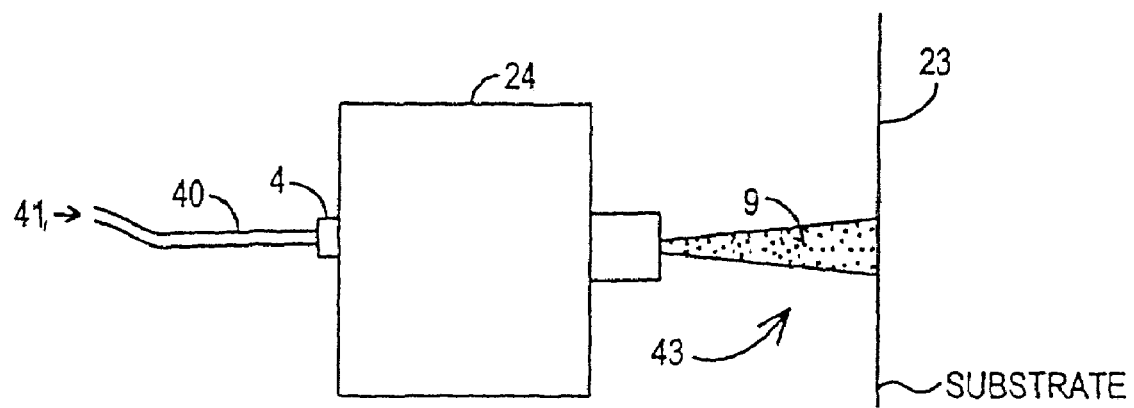
FIG. 4 shows a view of the plasma beam source of FIG. 1 with the beam directed toward a substrate and separate gas inlets.

FIG. 4 shows a plasma beam source 24 in a PECVD coating application. A mixture 41 of argon and oxygen is delivered to source port 4 in tube 40. A monomer precursor gas 43 is dispensed outside the source. A coating is deposited onto substrate 23 when the precursor gas is activated by the ionized gas in plasma 9. This process highlights an important advantage of the present invention: Due to the conductance limitation of nozzle 6 and to the high density and directionality of plasma 9 exiting through nozzle 5, precursor gas 43 does not readily enter source 24. This can be seen when, after a coating run, the discharge cavity 26 of beam source 24 is relatively free of PECVD coating. In prior art PECVD sources, the plasma electrode is exposed to the process. Since the plasma is most dense at the electrode, this exposed electrode quickly receives a thick coating that makes long process runs difficult.

Substrate 23 treated by source 24 can comprise a multitude of materials and shapes. Such substrates may include, for example without limitation, flexible webs, flat glass, three dimensional shapes, metals, silicon wafers and a variety of polymeric materials. Many other physical and process configurations are possible with the beam source 24. For instance, precursor gases can be ported into discharge cavity 26 without immediate buildup problems and some gases, such as hydrocarbons, can be fed into the source for extended periods. The PBS can also perform many plasma processes beyond PECVD such as plasma treatment, surface cleaning or reactive ion etching. The term "treat" a substrate is used to generically describe all these processes.

Figure 5:
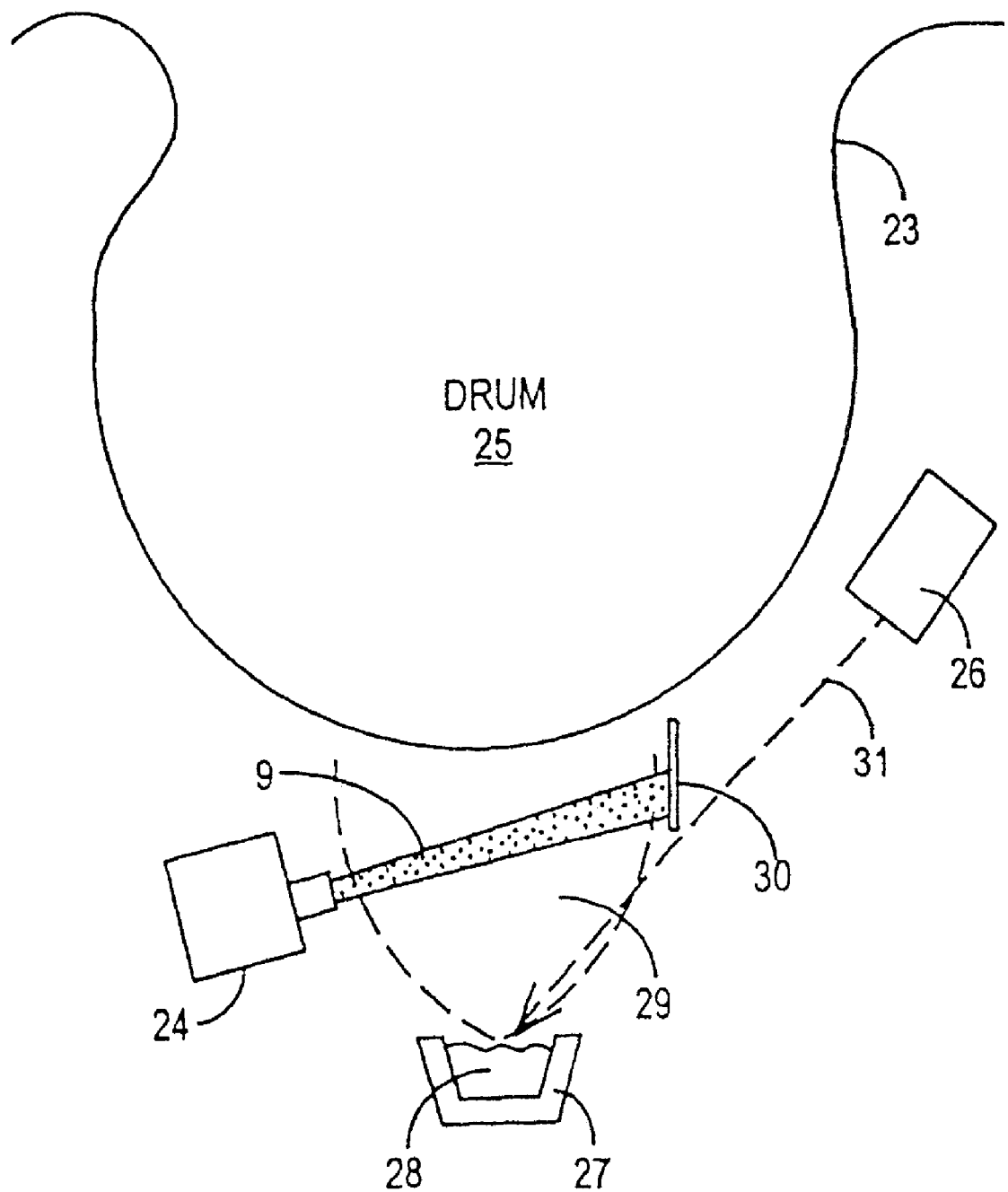
FIG. 5 shows a view of a plasma beam source of FIG. 1 used to assist reactive deposition in an electron beam evaporation application.

FIG. 5 shows plasma beam source 24 used to react evaporant 29 in an electron beam evaporation web coating application. Drum 25 carries web 23 over the deposition region. Crucible 27 contains evaporant material 28. Electron beam source 26 emits beam 31 into crucible 27. Plasma 9 is directed from the plasma beam source into the evaporant cloud 29 to promote reaction with the ionized gas of plasma 9. A shield 30 limits the effect of plasma 9 on electron beam 31. Prior to the present invention, hollow cathode sources have been used to accomplish evaporant reactance. Hollow cathodes are inherently non-uniform as the plasma outside of the hollow cathode is only diffusion limited. With the PBS, the magnetic field lines 19 contain the electrons, and by electrostatic forces, the ions are likewise contained in plasma region 9. Also as described above, the PBS plasma 9 is uniform over the substrate width due to the closed drift nature of the electron containment.

Figure 6:
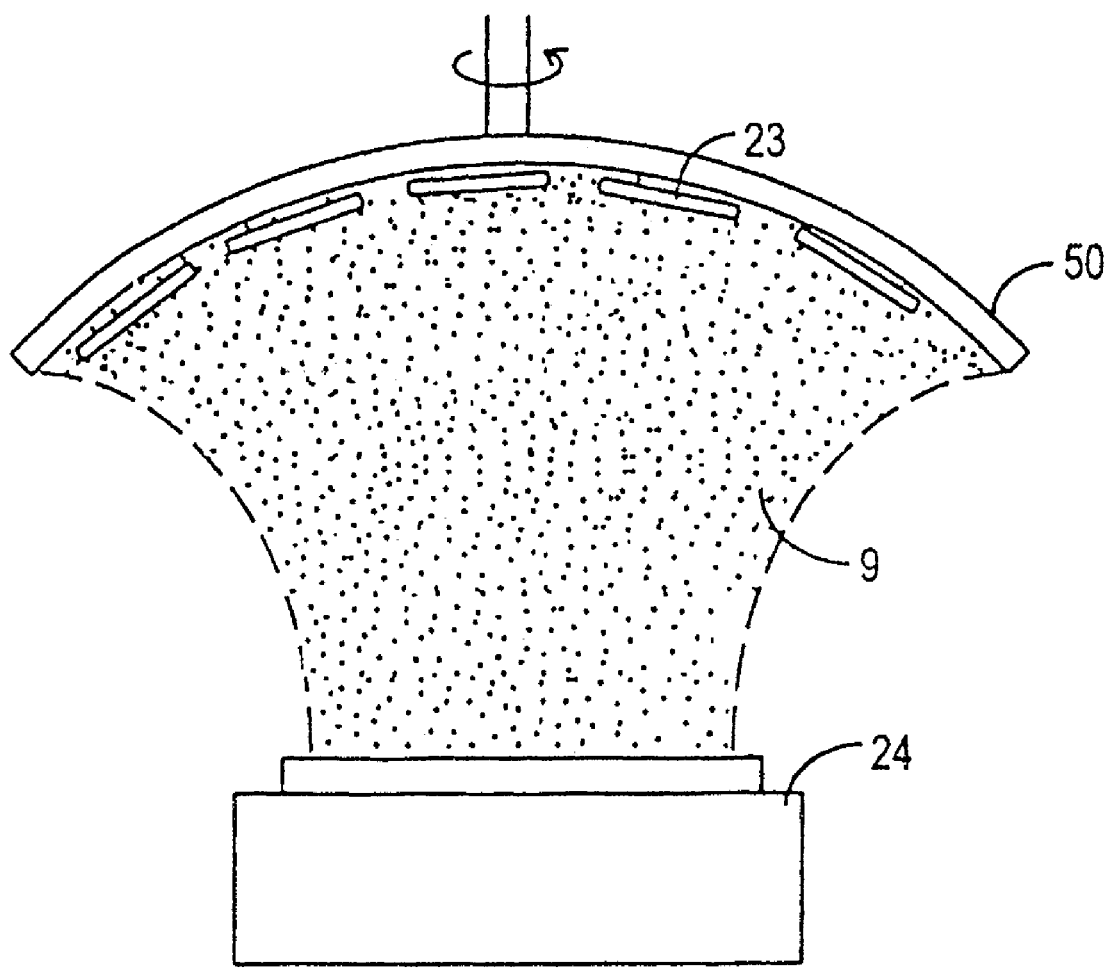
FIG. 6 shows a side view of a plasma beam source of FIG. 1 applied to a planetary/box coating application.

FIG. 6 depicts plasma beam source 24 applied to a planetary box coater application. In this view the source 24 is shown along its length rather than from an end view. In this view the plasma beam 9 appears as a sheet of plasma. Source 24 is placed distant from the substrate supporting planetary, say at the bottom of the box coater, and allows room for other deposition sources (electron beam or thermal evaporation sources for instance. By combining the PBS beam source 24 with other deposition sources, the coatings can be densified by the action of plasma 9. Pure argon can be used to densify a metal coating or a reactive gas can be added. A big benefit of the beam source over prior art is the ability of the beam source to directly consume reactive gases such as oxygen in the source. The prior art, due to the need for filaments or other electron generation means sensitive to consumption by reactive gas, required the use of an inert gas in the source. In these sources, the reactive gas was fed into the process outside the source. The poor efficiency of ionizing the reactive gas in the chamber required high source powers and high argon flow rates. With beam source 24 producing a pure reactive plasma (or a combination of inert and reactive, as required) the process efficiency is increased and the overall pumping speed needed to maintain the process at the correct pressure is reduced (the un-needed argon does not have to be pumped away).

Figure 7:
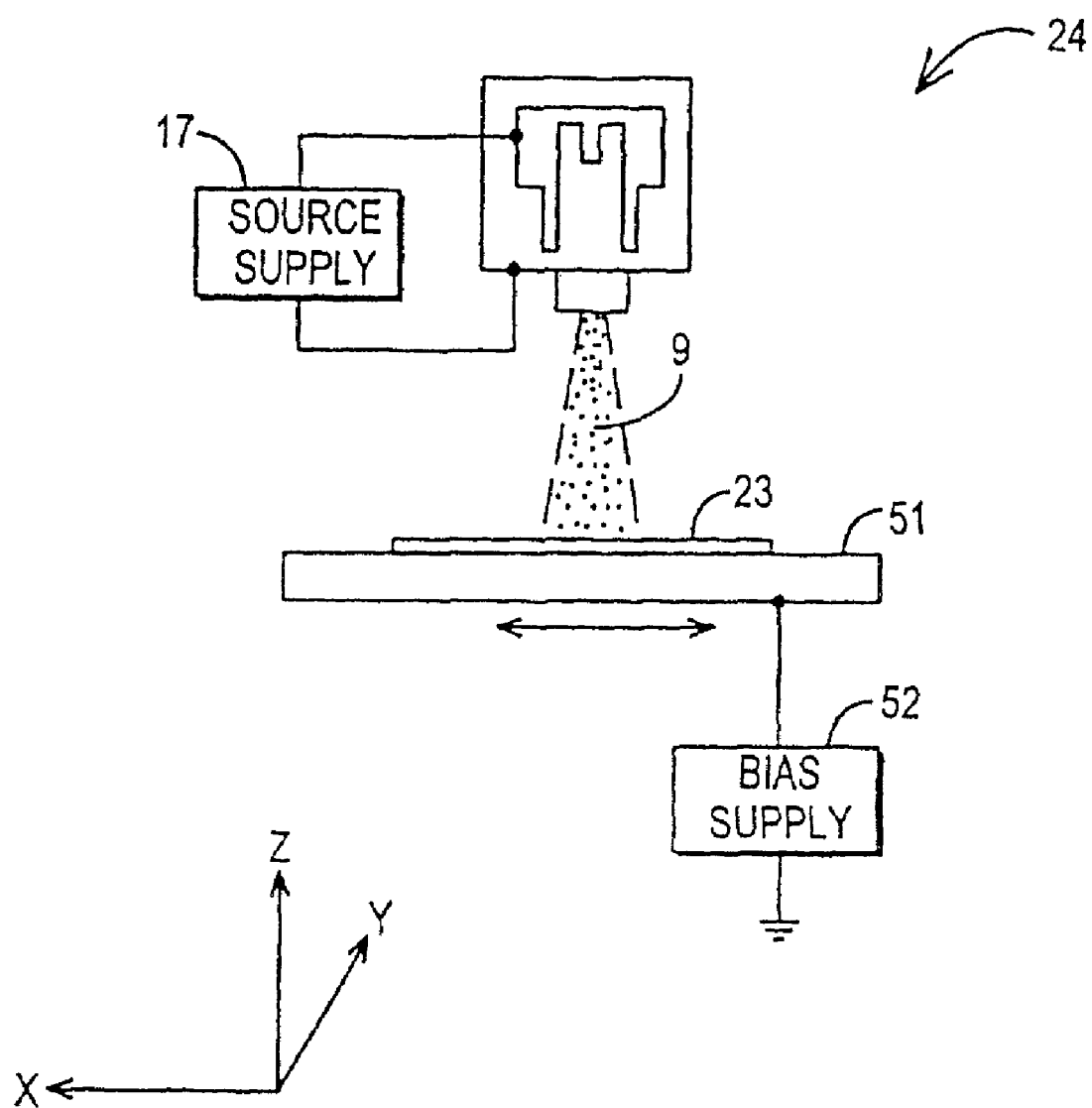
FIG. 7 shows a plasma beam source of FIG. 1 with the plasma directed onto a translating, biased substrate.

FIG. 7 shows plasma beam source 24 applied to a substrate 23 such as a silicon wafer. In this figure, stage 51 supporting the wafer 23 is translated to uniformly treat wafer 23 with plasma 9. The ability to separately bias substrate 23 from source 24 is depicted. Bias supply 52, in this case an AC supply of sufficient frequency to pass current through wafer 23, is connected to stage 51. PBS supply 17 produces plasma 9. Without bias supply 52, insulating substrate 23 would normally rise to the characteristic floating voltage of plasma 9. (This is between approximately −10 to −70 volts for the PBS depending upon process conditions.) By turning on bias supply 52, the voltage drop across the plasma dark space between plasma 9 and substrate 23 can be changed, positively or negatively, to a level required for the process.

Figure 8:
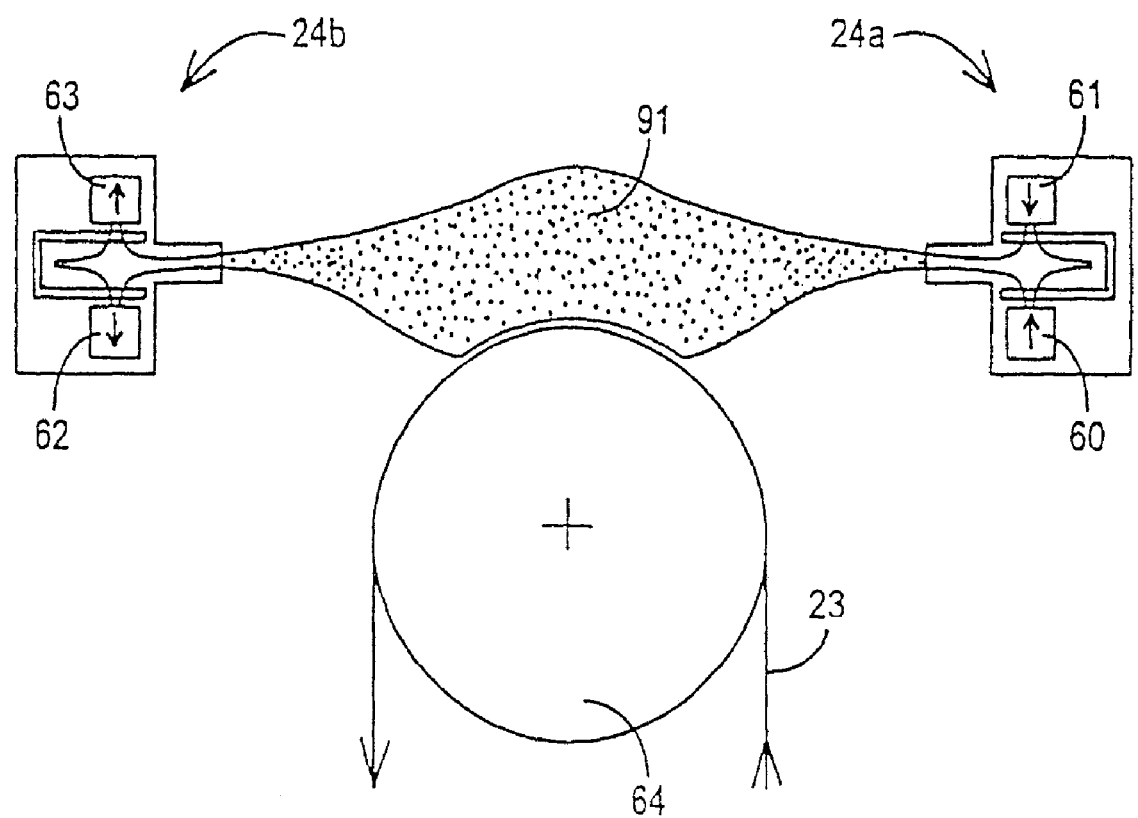
FIG. 8 shows two plasma beam sources of FIG. 1 facing each other with opposite pole magnets.

FIG. 8 shows how two beam sources, 24a and 24b that can be applied to generate a large area uniform plasma over a substrate. In this case the substrate is a flexible web 23 drawn over roll 64. The two beam sources 24a and 24b are identical except magnets 60 and 61 of source 24a (and the end magnets in this source not shown) arrange their south pole facing in toward the plasma 9 while source 24b has magnet 62 and 63 north poles facing inward. This configuration creates a sharing of magnetic fields between the sources and produces the closed plasma region 9 as shown.

Figure 9:
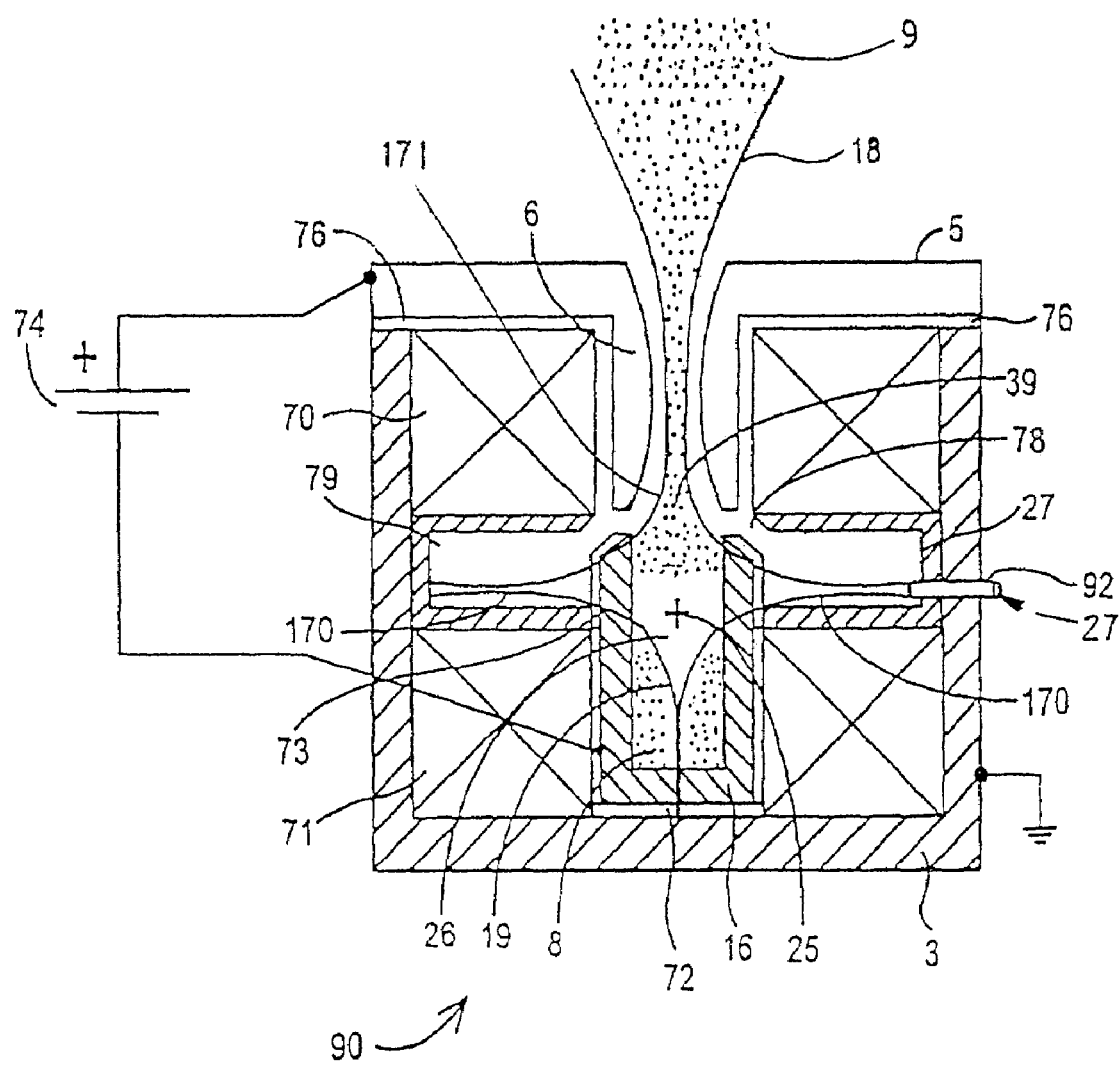
FIG. 9 shows a section view of an electromagnet version of the present invention for a space thruster application.

FIG. 9 shows a section view of a PBS configured for a space propulsion application. The basic components of a magnetron electron source and cusp magnetic field are the same as in earlier figures. In this source magnetic cusp fields 18 and 19 are created by annular electromagnets 70 and 71. Electron source magnetron plasma 8 is created within liner tube 16. Liner 16 is electrically isolated from box 3 by insulator plate 72 and from electromagnet 71 by insulator ring 73. Propellant gas 27 is passed into gas cavity 79 through port 92. Gas 27 then flows into discharge cavity 26 via gap 78 between liner 16 and opposed electrode 5. Cover electrode 5 is electrically isolated from round box 3 by insulator plate 76. Cover 5 has a nozzle portion 6 that fits down into the annular opening in electromagnet 70. Liner 16 and cover 5 are connected across power supply 74. A DC supply is shown with the cathode terminal connected to liner 16. An AC or RF power supply may also be used. Box 3 is connected to ground. Cover 5 can be connected to ground along with the one side of the power supply.

In operation, when power supply 74 is turned on and gas 27 is flowing into discharge cavity 26, electrons created by magnetron plasma 8 are trapped in mirror field region of magnetic field 18 and plasma 39 and 9 are created. Thrust is generated as the plasma 9 is expelled through nozzle 6. One component of the thrust is generated by the magnetic nozzle effect. After passing through magnetic mirror 39, electrons then experience a decrease in magnetic field strength as they move further from nozzle 6 into space. In response to this negative gradient, electron motion is converted from thermal spinning to kinetic motion along the axis of the field lines. The electrons in turn electrostatically urge ions into accelerating away from the source. Another form of ion thrust can be produced if the magnetic field in region 18 can be increased to confine the ions (this occurs as the magnetic field strength exceeds at least 1000 Gauss). Under this condition, the ions can be magnetically confined and heated by the radial electric field as they pass through nozzle 6. As they exit the nozzle they are accelerated by both the electrostatic repulsion from anode 5 and by the magnetic nozzle effect.

Another aspect of the electron confinement of the preferred embodiments is two of the possible three axial magnetic field electron escape paths are physically bound by liner 16. The three axial magnetic field regions include cone shaped compressed regions 171 and 19 and planar disk compressed region 170. When liner 16 is connected as the cathode of a DC circuit or is on a negative AC cycle of an AC power supply, electrons are electrostatically reflected from the surfaces of liner 16 surfaces. Electrons are initially created in magnetron confinement region 8. As these electrons attempt to reach anode electrode 5, they travel by collisional diffusion across field lines 19 and through mirror region 39 to exit the source through nozzle 6 before returning to cover 5. While diffusing across magnetic field lines electrons also spiral along these field lines. By configuring the source so magnetic field lines 170 pass through liner 16, electrons moving along these field lines remain electrostatically contained. If field lines 170 were allowed to pass through an electrically floating surface or opposed electrode 5, some number of electrons would escape through the compressed mirror of field lines 170. Allowing only one axial magnetic field region 18 to be open to electron escape increases the efficient use of electrons in creating and sustaining plasma plume 9.

Figure 10:
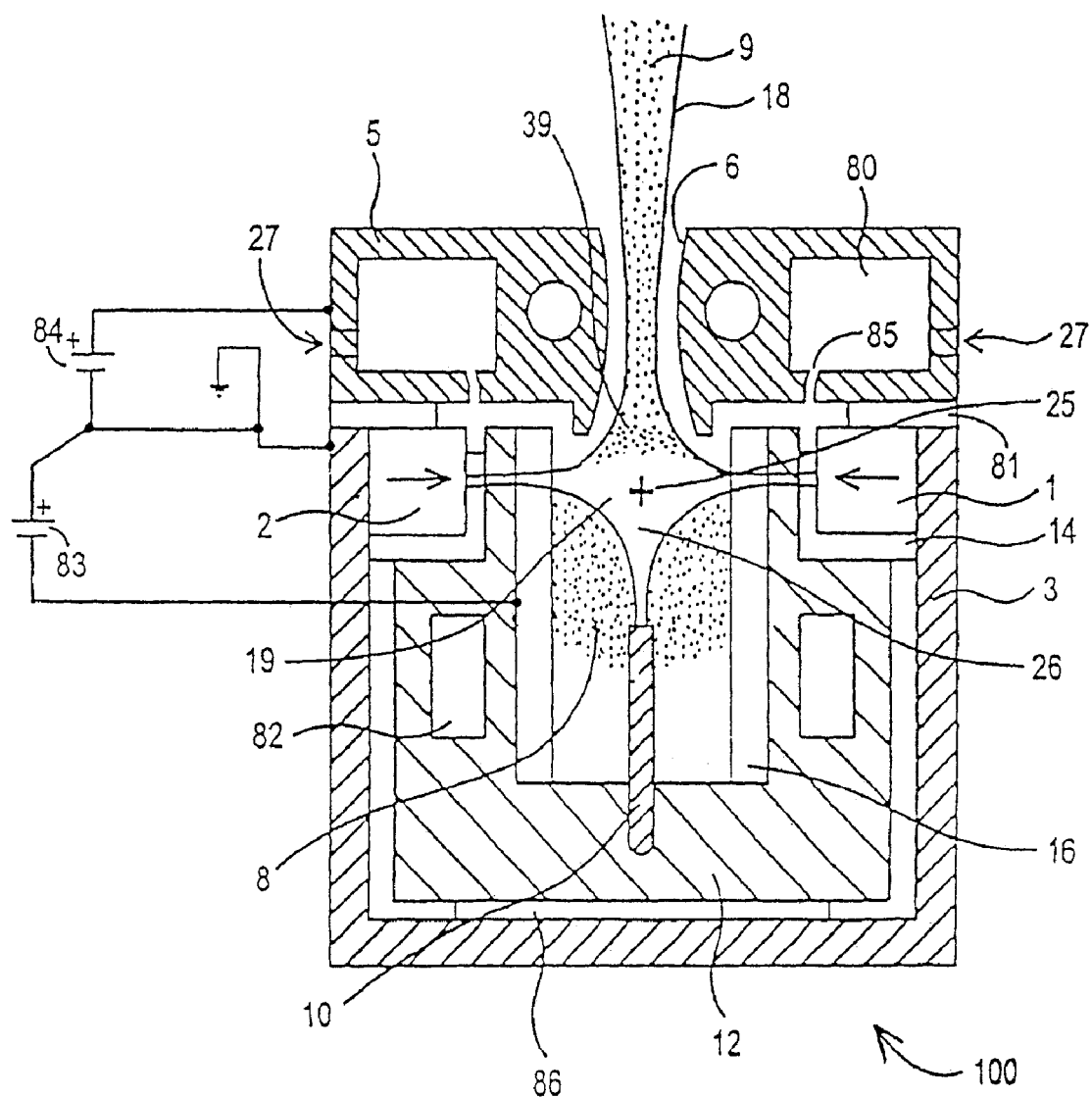
FIG. 10 shows a preferred embodiment with an electrical power arrangement enhancing the ion source aspects.

FIG. 10 shows another embodiment of the plasma beam source. As described earlier, this source can be circular, annular or extended length wise. Source 100 includes the use of rare earth magnets 1 and 2 and the use of two power supplies 83 and 84. As shown, power supply 83 connects cathode liner 16 to box 3. Insulator 81 separate box 3 electrically from cover 5. Power supply 84 connects anode cover 5 to box 3. Box 3 is grounded. Using this configuration, the plasma potential can be adjusted relative to ground. This can be useful when applying the plasma 9 to a grounded substrate. By raising the plasma potential, the ion energy striking the substrate can be increased. FIG. 10 also shows process gas manifolds 80 built into cover 5. Small distribution holes 85 conduct the gas 27 uniformly along the length of the source into discharge cavity 26. By facing the magnets 1 and 2 toward each other in a cusp arrangement, a strong mirror compression ratio in mirror region 39 is created. With rare earth magnets 1 and 2, the field strength at the mirror apex can readily exceed 500 gauss. As electrons pass through mirror region 39, they experience this strong field and their Larmor gyro radius is correspondingly small. Under these conditions, when the plasma is viewed from the end as in this section view, the plasma 9 width passing through nozzle 6 is very narrow, on the order of 3 mm. This is an advantage over vertically directed magnets of Window and Savvides and Helmer among others. With vertically oriented magnets, while a null region 25 is created above the magnetron confined region 8, the field strength is typically less than 100 Gauss and the electron Larmor gyro radius is larger. In the embodiment shown in FIG. 10, shunt 10 is fitted into aluminum body 12. The purpose of shunt 10 is to help reduce the sputter rate of liner 16 and to even out liner 16 sputtering to make liner 16 last longer. While helpful in this regard, it is not necessary to the fundamental source operation. Body 12 is water cooled by extruded holes 82. Insulators 14 and 86 support cathode body 12 in box 3 and electrically isolate the cathode (body 12 and liner 16) from box 3. As shown in FIG. 1A, source 100 may be rectangular of an extended length. End magnets, used to make both magnetic field regions 8 and 9 closed paths, are not shown in this section view.

Figure 11:
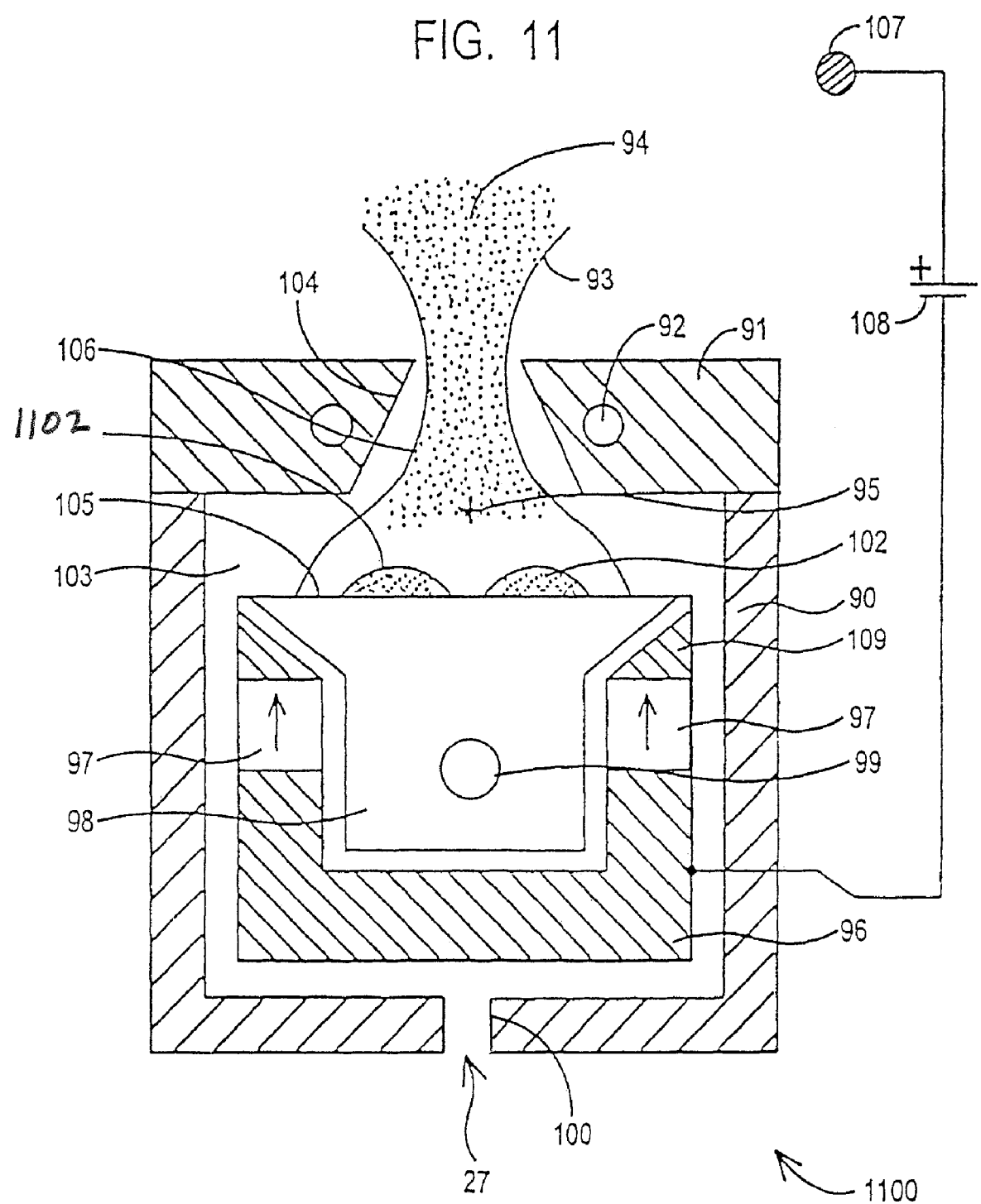
FIG. 11 shows a section view of a plasma beam source implementing vertically oriented magnets and a planar cathode.

FIG. 11 shows a variation of a plasma beam source 1100 with vertically oriented magnets. This magnet configuration is representative of a Type II unbalanced magnetron magnetic field as taught by Window and Harding. This embodiment shows that a range of magnet 97 and discharge cavity 103 shapes can be implemented within the spirit of the present invention. In this embodiment, magnets 97 create two confinement regions: magnetron confinement 1102 at cathode 98 surface 105 and mirror/nozzle confinement 93 through nozzle 104. As in other preferred embodiments, a magnetron electron generation region 102 is contained in a discharge cavity 103. The discharge cavity contains a null magnetic field region 95. A nozzle opening 104 in cover plate 91 is coincident with the axis of mirror field 93. This embodiment is constructed as follows: Planar liner 98 is water cooled via gun drilled hole 99 and is fitted into shunt 96. Magnets 97 and angled shunts 109, along with shunt 96 produce the unbalanced magnetic field depicted. Shunts 96 and 109 are made of magnetic steel. Planar cathode 98 and magnet components 96, 97 and 109 are suspended by electrical insulators (not shown) in electrically floating box 90. Electrically floating cover plate 91 is fastened to box 90. Cover plate 91 is water cooled via holes 92. Box 90 and cover plate 91 are made of aluminum and are non-magnetic. Piping to direct water to cover plate 91 and cathode 98 is not shown. Gas 27 is piped into box 90 through threaded hole 100. Gas 27 flows around magnet shunt 96 and into discharge cavity 103. As in other embodiments of the present invention when power supply 108 is turned on a magnetron plasma 102 lights and supplies electrons to mirror confinement region 106. Electrons caught in mirror confinement region 106 collide with gas 27 also attempting to exit through the nozzle 104 opening and dense plasma 94 is created.

Another aspect of the present invention depicted in FIG. 11 is the use of a separate anode 107. As shown, the cover 91 is not connected as an electrode in the electrical circuit. The important aspect of cover 91 is to produce a conductance limitation to exiting gas 27, thereby forcing the gas to exit through mirror confinement region 106 in nozzle 104. Electrically, given the high mobility of electrons, positioning the return electrode 107 outside the source produces little noticeable change in source performance after the source lights. Because anode 107 is more distant from the cathode 98, a pressure spike may be needed in cavity 103 (depending upon the base pressure and the ignition voltage of the power supply 108 used) to start the plasma 102. Once a conductive plasma 102 has ignited, the anode electrode can be located in any location within the process chamber. When the anode electrode is nozzle 104, some ion acceleration benefits can be obtained, as described earlier. In the source shown in FIG. 11, the material of liner 98 is aluminum. Aluminum has the advantage of being a good secondary electron emitter when oxygen gas 27 is used and the reactive product, alumina, forming on the cathode surface 105 sputters very slowly. These are advantages to beam source operation because a high electron current for a given power is generated and cathode material 98 is slow to be sputtered away. Other materials having these properties may also be used. When an argon plasma 94 is desired, a good cathode material is carbon. While not an exceptional secondary electron emitter, carbon sputters very slowly in argon. Note that FIG. 11 is a section view. As shown in earlier figures, this source can be round or rectangular and can be extended to lengths longer than 1 meter.

Figure 12A:
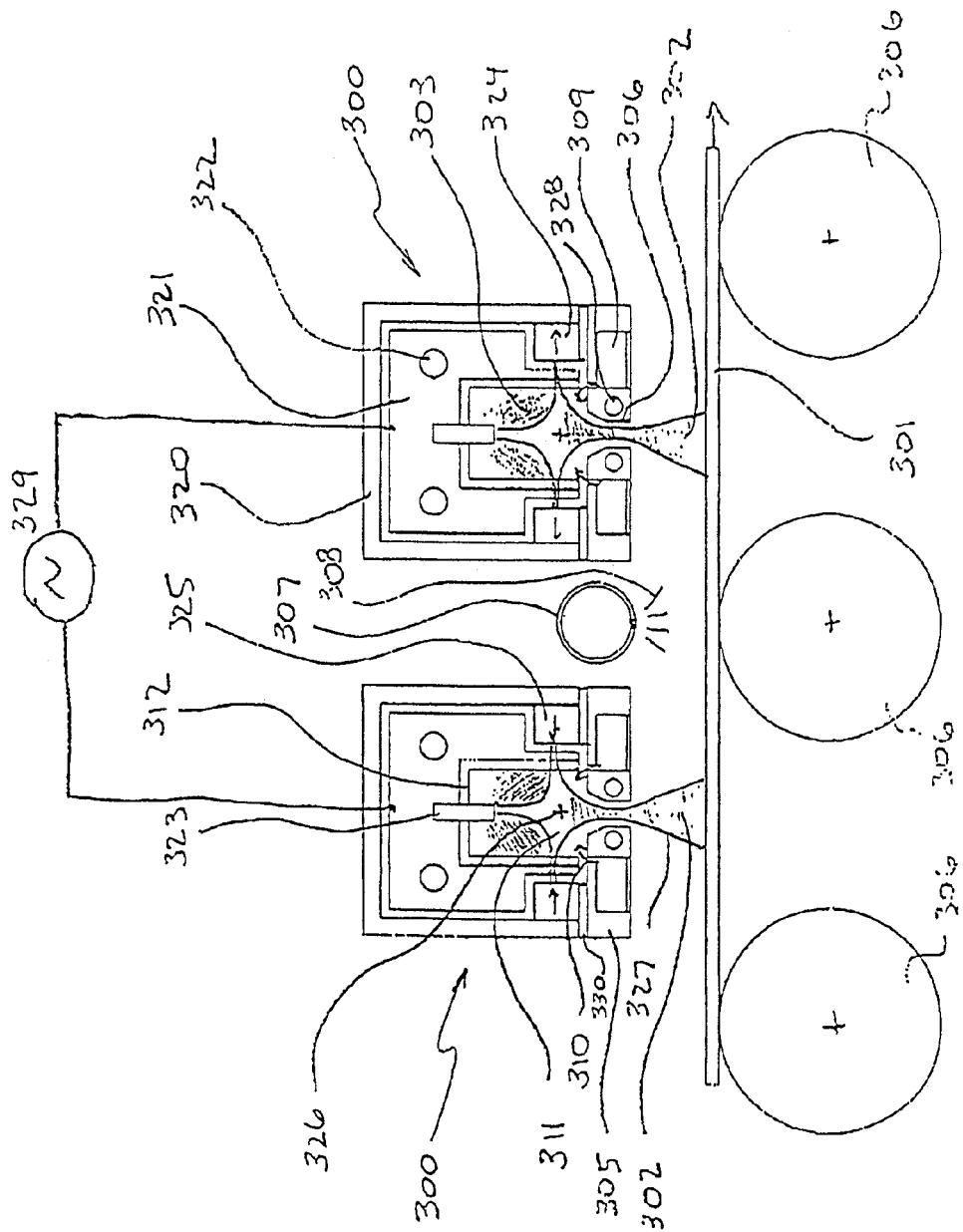
FIG. 12A shows two plasma beam sources connected across a single AC power supply in accordance with a preferred embodiment of the present invention.

FIG. 12A shows a section view of a dual PBS configuration implementing two sources 300 in accordance with a preferred embodiment of the present invention. In this embodiment, sources 300 are positioned over a planar substrate 301, such as architectural glass, for the purpose of applying a PECVD coating. Sources 300 are shown in a section view and can be long, over 3 meters in length. Glass substrate 301 is conveyed on rollers 306 under plasma beam sources 300. Plasma beam sources 300 are identical except magnets 324 and 325 are reversed in polarity between the two sources. Shunt box 320 supports magnets 324 or 325. Core 321 is supported inside box 320 by insulators (not shown). Core 321 is water cooled via gun drilled holes 322 and interconnecting water piping (not shown). Target liner 312 is fastened to core 322 as is center shunt 323. These three parts are electrically connected together and form the source electrode. Top plate 305 contains manifold 309 for distributing gas 310 inside source cavity 311 uniformly along the source length. Plate 305 also has nozzle 306 centered over cavity 311. Plate 305 is water cooled via gun drilled holes 328. Plate 305 is fastened to box 320 with screws (not shown). Aluminum frame 330 spaces plate 305 from box 320.

The two source 300 core electrodes 321 are connected on opposite sides of AC power supply 329. Power supply 329 is an alternating current power supply with a frequency range between 20 kHz to 500 kHz. This mid frequency range is preferred because it is sufficiently high frequency to capacitively couple current through insulating film buildups on electrode surfaces. Also, mid frequency power supplies rated for 10's of kW are readily available and they are relatively low cost. Power supplies with higher or lower frequencies can also be used. Source 300, boxes 320 and top plates 305 can be grounded or floating.

Reactive and/or inert gases 310 are fed into source discharge cavities 311 via manifolds 309. External to the sources 300, manifold 307 dispenses a precursor gas 308. For instance, gas 310 can be oxygen gas and gas 308 can be silicon containing gas such as hexamethyldisiloxane (HMDSO). By delivering the precursor gas 308 external to the PBS, insulating coating buildups inside sources 300 are minimized. This is an important benefit to the PBS over prior art PECVD sources (see FIG. 4).

In operation, sources 300 each alternate as the cathode electrode. As the cathode, magnetron 303 inside discharge cavity 311 ignites and emits electrons driving mirror plasma 302. While one PBS is a cathode, the second PBS is the anode for the circuit. With a single PBS, over time, while the PBS internal liner electrode 312 remains relatively free from deposition, the return current path though ground can possibly become coated with insulating film. This phenomenon is termed the "disappearing anode" effect and is well known in reactive sputtering processes. By configuring two PBS across an AC power supply, not only are both electrodes 312 "hidden" from the insulating deposition occurring in the process chamber, but as each electrode in turn operates as a cathode, thin insulating build-ups are continuously removed. This configuration allows a continuous, long term, insulating film PECVD process. Electrically this configuration is similar to dual magnetron cathode apparatus described in publications by Estes and Westwood and by Scherer, Schmitt, Latz and Schanz. The separation of the electron generating magnetron discharge from the process chamber by a nozzle aperture is the difference—and the significant benefit—of the PBS over a dual unbalanced magnetron configuration for PECVD.

In PECVD, the breakdown of precursor gases occurs in the presence of plasma. If the electrodes driving plasma generation are exposed to the precursor gas, a significant percentage of deposition occurs on the electrode. This is especially true when sputter magnetron type plasma sources are used and the precursor is exposed to the intense racetrack negative glow. Coating buildup on the electrode(s) causes severe process difficulties: The electrical circuit impedance varies with the buildup affecting process stability. The efficiency of the process, including the deposition rate and materials usage, is reduced to the degree deposition occurs on the electrodes. Long coating runs on substrates like flexible webs or architectural glass are not practical. And, the maintenance to continually clean or replace the exposed electrodes is onerous. With the dual PBS configuration, coating buildup on the internal magnetron cathodes is minimal and long PECVD coating runs are made possible.

Figure 12B:
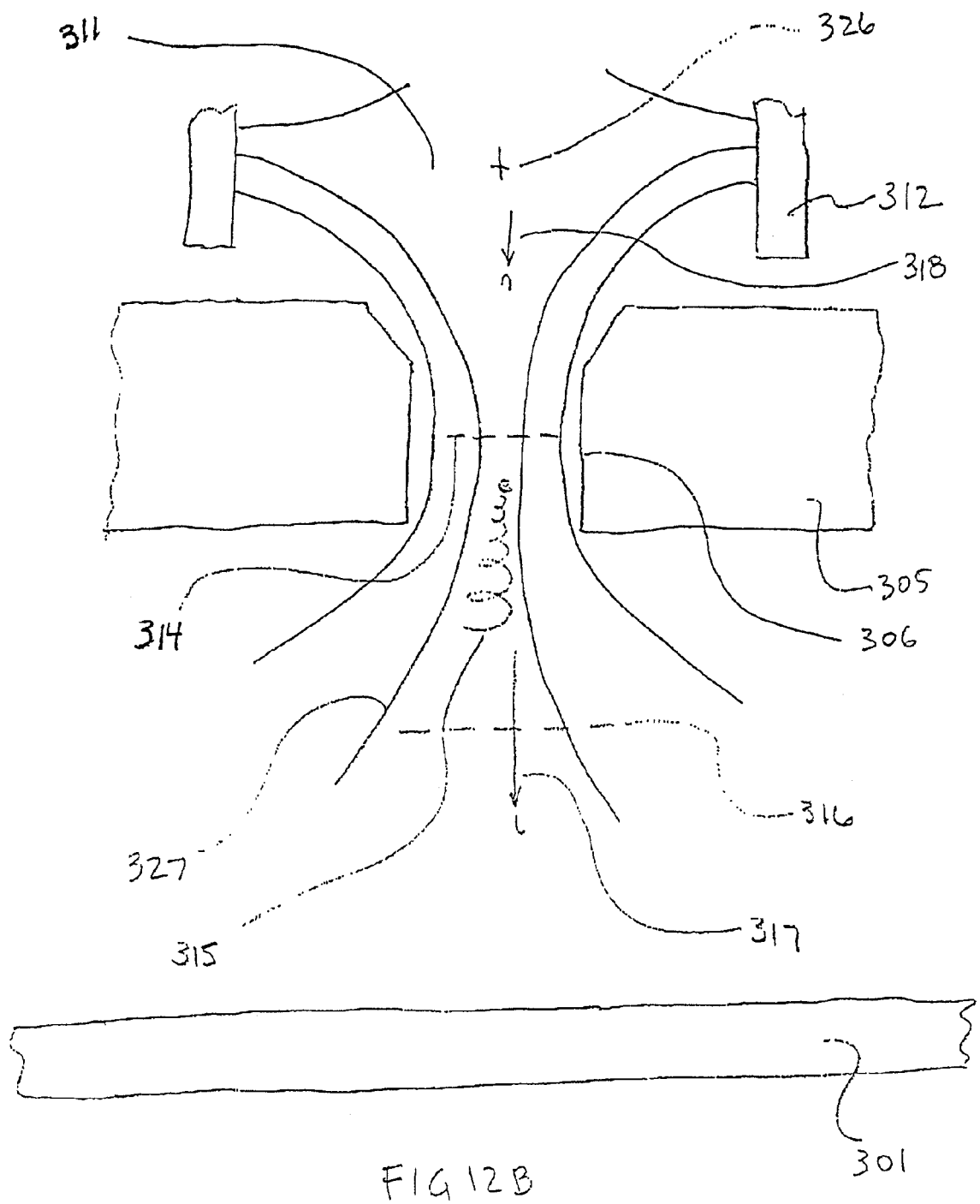
FIG. 12B shows a detailed view of the nozzle region of one plasma beam source PBS.
Figure 13:
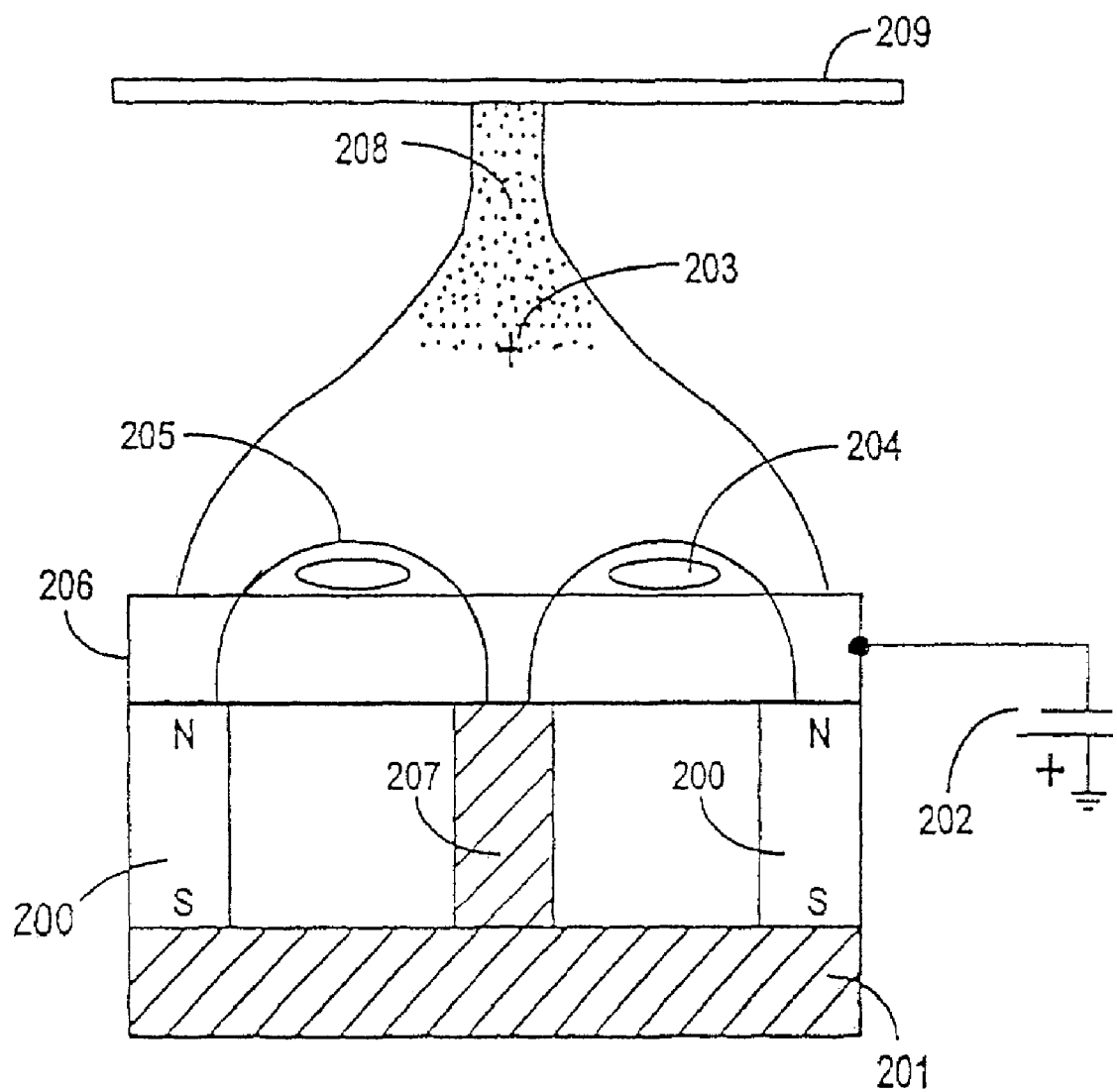
FIG. 13 shows a section view of a prior art unbalanced magnetron sputter source.

Another important feature of the dual PBS configuration shown in FIG. 12A is the generation of an ion beam emanating out of sources 300 on alternate power supply cycles. FIG. 12B shows a detail view of the nozzle region of one PBS to explain this effect. During operation of the dual PBS with an AC power supply, each PBS is the anode while the other PBS is the cathode. While an anode, all electrons 315 must flow to it to return to the power supply. To reach the internal electrode 312 of the PBS, electrons 315 must enter cavity 311 through nozzle opening 306. As electrons 315 move toward this opening, they are impeded by the mirror magnetic field 327 emanating through nozzle opening 306. Mirror field 327 is created by the strong magnetic field in nozzle 306 extending out to a weaker field region closer to substrate 301. As electron current flow is impeded across the mirror, a voltage drop is produced. Dotted lines 316 and 314 roughly bound the region of this voltage drop. Dotted line 314 is at the strongest region of the magnetic field in nozzle 306. Dotted line 316 is a region of weaker magnetic field and approximates the start of mirror electron confinement. The location of line 316 is shown for illustrative purposes and may be closer to the substrate depending on the position of the substrate and the strength of the magnetic field lines 327. As electrons 315 are being impeded from flowing into cavity 311, gas atoms 318 are flowing out of cavity 311 through nozzle 306. These neutral atoms collide with electrons 315 and ions 317 are formed. Ions 317 then experience the electric field across lines 314 to 316 and ions 317 are accelerated out of source 300 toward substrate 301. This overall effect is similar to ion sources employing the "End Hall" effect with an axial electron mirror confinement. In operation, a dense, linear beam of ions 317 flows out of source 300 toward substrate 301 on each half cycle. At the same time electrons flowing out of the cathode PBS neutralize this ion beam. The result is an ideal neutralized, uniform, dense ion beam impinging on the substrate. The ion energy is approximately 60-120 eV.

It is important when installing sources 300 that water piping lines routing cooling water to core 321 are insulated to prevent electrons from reaching them. If a water fitting or other component at the electrode potential can be reached by electrons in the process chamber, the electrons will flow to this component during the anode cycle. This occurs because the electrons do not want to fight through the mirror impedance in nozzle 306 if an "easier" route back to the power supply can be found.

It is well known in the art that film quality is greatly improved by ion bombardment. Without ion bombardment PECVD films can be soft and low density. To produce high quality, dense films ion bombardment is often used. This is commonly done by biasing the substrate or by using a separate ion source. Biasing the substrate is relatively simple though an additional power supply is needed. However, some substrates like thick plastics or architectural glass are difficult to bias. The second method, the use of a separate ion source suffers from the problem of electrode exposure; also, ion sources typically lack the linear configuration and current density required for large area, high rate PECVD. The dual PBS configuration shown in FIGS. 12A and 12B solves these problems and has several important advantages:

- Long, continuous deposition runs are possible for such applications as in-line architectural glass coating and roll coating flexible webs. The importance of protecting the electrodes from coating can not be over stressed in these applications. In a practical application of the dual PBS, many 100's of microns of an insulating films such as $SiO_2$ can be deposited on a substrate with only minimal coating inside the internal discharge cavities 311.
- The magnetic electron confinement enables uniform coating over large areas. In prior art PECVD processes simple, exposed, RF planar electrodes have often been used. Not only are these RF electrodes quickly coated up, but plasma uniformity across a large electrode is difficult to achieve and maintain.
- The 60-120 eV ion beam alternating out of each PBS is unique and enables dense, high quality, useful films. This uniform, neutralized ion beam is very beneficial to PECVD processes.
- The dense plasma emanating out of the PBS, both the electron beam out of the cathode and the ion beam out of the anode (alternating with the power supply), effect a high deposition rate. For instance, in depositing silicon dioxide films using oxygen gas and HMDSO, dynamic deposition rates of 200 nm-m/min are routinely achieved.
- The dual PBS can operate at low pressure relative to non-magnetically confined PECVD sources. This allows the use of high powers without powder formation and therefore enables high deposition rate, high film quality processes.

The plasma beam source has many benefits and applications. While several configurations have been disclosed herein, many more within the spirit of the invention are possible. A primary application of the PBS is PECVD on large area substrates. Within this application area, many substrates and coating processes are possible. The range of substrates includes many different sizes and shapes. An incomplete list would include both narrow and wide flexible webs, large planar substrates like architectural and vehicle glass or photovoltaic panels and groups of three dimensional parts, like automobile windshield and head lamp reflectors or cell phone covers. Many substrate materials can be used including insulating materials like plastics and glass, conducting metals and semiconductor materials. A wide range of materials can be deposited by PECVD using the PBS with the extensive precursor selection available. Films like $SiO_2$, $TiO_2$, SiN, SiC and mixes of all these are all easily deposited as the precursors are readily available, present minimal safety and environmental challenges and are low cost. Also, many metal, metal nitride and metal oxide containing precursors are available today that can be advantageously used. PECVD with the PBS can be applied to a number of thin film applications, for instance, barrier films, optical coatings, abrasion resistant films, functioning electrical films, photocatalytic coatings, anti-bacterial coatings, transparent electrically conducting films, color shifting coatings and emissive films. Beyond PECVD, other PBS uses include reactive ion etching, plasma cleaning, assisting a reactive deposition process and plasma treatment as described above.

I claim:

1. Apparatus for generating a plasma, comprising in combination:
   a) a first and a second plasma source, each including a discharge cavity having a first width; a nozzle extending outwardly from said discharge cavity, said nozzle having a second width which is less than the first width; at least one electrode within said discharge cavity; and a plurality of magnets disposed adjacent said cavity for creating a magnetic field null region within said discharge cavity; and
   b) an AC power source connected across the at least one electrode in each discharge cavity for energizing the electrodes alternatively as a cathode and an anode, each of said electrodes serving as a cathode electrode being capable of supporting at least one magnetron discharge region within the respective discharge cavity.

2. The apparatus as set forth in claim 1, wherein the ionizable gas inlet is located between the electrode and the nozzle within each discharge cavity.

3. The apparatus as set forth in claim 2, wherein a mirror magnetic field is disposed out of said nozzle of said first plasma source and out of said nozzle of said second plasma source.

4. The apparatus as set forth in claim 1, wherein a flow of electrons is impeded alternatively from said first plasma source and from said second plasma source, respectively, during a half cycle of said AC power source.

5. The apparatus as set forth in claim 1, further including a drive for transporting a substrate past said plasma sources whereby to effect uniform deposition on the substrate.

6. The apparatus as set forth in claim 1, further including a first pair of magnets facing one another disposed in said first plasma source and a second pair of magnets facing one another disposed in said second plasma source for creating a confinement region within each of the respective one of said first and second plasma sources.

7. The apparatus as set forth in claim 6, wherein said first pair of magnets exhibit a first polarity and said second pair of magnets exhibit a second polarity.

8. The apparatus of claim 1, further including a first pair of magnets aligned parallel to one another disposed in said first plasma source; and a second pair of magnets aligned parallel to one another disposed in said second plasma source for creating a confinement region within each of the respective one of said first and second plasma sources.

9. The apparatus of claim 1, wherein the first and second plasma sources are located within a process chamber, and including an inlet for introducing a precursor gas into the process chamber external to the nozzles.

10. The apparatus of claim 9, wherein the precursor gas comprises a silicon containing gas.

11. The apparatus of claim 10, wherein the silicon containing gas comprises hexamethyldisiloxane.

12. The apparatus of claim 1, and including a second inlet, other than said nozzle for introducing a non-condensing gas into the discharge cavity of each plasma source.

13. The apparatus of claim 12, wherein the non-condensing gas comprises oxygen.

14. A method of plasma treating a substrate comprising the steps of:
   a) providing a first and a second plasma source, each including a discharge cavity and an outlet for discharging a linear ion beam onto the substrate;
   b) providing an AC power source across an electrode disposed in each discharge cavity and energizing the electrodes in the first and second plasma sources alternatively as a cathode and an anode, each electrode when serving as a cathode electrode being capable of supporting at least one magnetron discharge region within the discharge cavity;
   c) establishing mirror magnetic fields out of the first and second plasma sources;
   d) impeding a flow of electrons by the mirror magnetic field in the first plasma source when the electrode in the discharge cavity of the second plasma source serves as a cathode during a half cycle of the AC power source and impeding the flow of electrons by the mirror magnetic field in the second plasma source when the electrode in the discharge cavity of the first plasma source serves as a cathode during a half cycle of the AC power source;
   e) introducing an ionizable gas into the discharge cavity of each of the first and second plasma sources;
   f) ionizing at least some of the atoms of the ionizable gas encountering the impeded electrons; and
   g) alternatively discharging ions from each nozzle in the form of an ion beam onto a substrate.

15. The method as set forth in claim 14, including the step of transporting the substrate past the ion beams.

16. The method as set forth in claim 14, wherein a first pair of magnets facing one another are disposed in the first plasma source and a second pair of magnets facing one another are disposed in the second plasma source, and including the step of creating a confinement region within each of the respective one of the first and second plasma sources with the first and second pairs of magnets.

17. The method as set forth in claim 16, wherein the first pair of magnets exhibits a first polarity and wherein the second pair of magnets exhibits a second polarity.

18. The method as set forth in claim 14, wherein the substrate comprises glass.

19. The method as set forth in claim 14, wherein a first pair of magnets aligned parallel to one another are disposed in the first plasma source and a second pair of magnets aligned parallel to one another are disposed in the second plasma source, and including the step of creating a confinement region within each of the respective first and second plasma sources with the first and second pairs of magnets.

20. The method as set forth in claim 14, wherein the substrate comprises a metal or a plastic.

21. The method of claim 14, and including the step h) of introducing a precursor gas within the process chamber external to the plasma sources.

22. The method of claim 14, and including the step of introducing a non-condensing gas into the discharge cavity of each of the first and second plasma sources.

23. The method of claim 22, wherein the non-condensing gas comprises oxygen.

24. The method of claim 21, wherein the precursor gas comprises a silicon containing gas.

25. The method of claim 24, wherein the silicon containing gas comprises hexamethyldisiloxane.

26. A method of generating a plasma, comprising the steps of:
   a) providing a first and a second plasma source, each including a discharge cavity having an outlet for discharging a linear ion beam onto a substrate;
   b) providing an AC power source across an electrode disposed in each discharge cavity and energizing the electrodes in the first and second plasma sources alternatively as a cathode and an anode, each electrode when serving as a cathode electrode being capable of supporting at least one magnetron discharge region within the discharge cavity;

c) establishing a mirror magnetic field out of the outlet of the first plasma source and out of the outlet of the second plasma source;

d) impeding a flow of electrons by the mirror magnetic field in the first plasma source when the electrode in the discharge cavity of the second plasma source serves as a cathode during a half cycle of the AC power source and impeding the flow of electrons by the mirror magnetic field in the second plasma source when the electrode in the discharge cavity of the first plasma source serves as a cathode during a half cycle of the AC power source;

e) introducing an ionizable gas into the discharge cavity of each of the first and second plasma sources;

f) ionizing at least some of the atoms of the ionizable gas encountering the impeded electrons; and g) alternatively discharging the ions from each outlet in the form of an ion beam.

27. The method as set forth in claim 26, including the step of transporting a substrate past the ion beams.

28. The method as set forth in claim 26, wherein a first pair of magnets facing one another are disposed in the first plasma source and a second pair of magnets facing one another are disposed in the second plasma source, and including the step of creating a confinement region within each of the respective one of the first and second plasma sources with the first and second pairs of magnets.

29. The method as set forth in claim 26, wherein the first pair of magnets exhibit a first polarity and wherein the second pair of magnets exhibit a second polarity.

30. The method as set forth in claim 26, wherein a first pair of magnets aligned parallel to one another are disposed in the first plasma source and a second pair of magnets aligned parallel to one another are disposed in the second plasma source, and including the step of creating a confinement region within each of the respective first and second plasma sources with the first and second pairs of magnets.

* * * * *